United States Patent
Chan et al.

(10) Patent No.: US 10,848,005 B1
(45) Date of Patent: Nov. 24, 2020

(54) DIGITAL SHUNT REGULATION FOR A WIRELESS-POWER RECEIVER

(71) Applicant: Hong Kong Applied Science and Technology Research Institute Company, Limited, Hong Kong (HK)

(72) Inventors: Chi Hong Chan, Hong Kong (HK); Gordon Chung, Hong Kong (HK); Bun Go Yau, Shenzhen (CN)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 43 days.

(21) Appl. No.: 16/404,864

(22) Filed: May 7, 2019

(51) Int. Cl.
| | |
|---|---|
| *H02J 50/12* | (2016.01) |
| *H02J 50/20* | (2016.01) |
| *H04L 27/04* | (2006.01) |
| *H03K 5/24* | (2006.01) |
| *H02J 50/80* | (2016.01) |
| *H02M 7/06* | (2006.01) |

(52) U.S. Cl.
CPC ............. *H02J 50/12* (2016.02); *H02J 50/20* (2016.02); *H02J 50/80* (2016.02); *H03K 5/2472* (2013.01); *H04L 27/04* (2013.01); *H02M 7/06* (2013.01)

(58) Field of Classification Search
CPC ...... H03G 1/007; H03G 1/0088; H03G 3/001; H02J 50/12; H02J 50/20; H02J 50/80; H04L 27/04; H03K 5/2472
See application file for complete search history.

(56) References Cited

U.S. PATENT DOCUMENTS

| | | | |
|---|---|---|---|
| 5,045,770 A | 9/1991 | Brooks | |
| 7,679,345 B1 | 3/2010 | Verma et al. | |
| 8,248,127 B2 | 8/2012 | Chan et al. | |
| 8,643,432 B1 | 2/2014 | Chan et al. | |
| 9,684,326 B2 | 6/2017 | Lee | |
| 9,768,637 B2 | 9/2017 | Kwon et al. | |
| 9,966,913 B2 | 5/2018 | Chan et al. | |
| 2014/0036560 A1* | 2/2014 | Satyamoorthy | H02J 5/005 363/126 |
| 2015/0004909 A1 | 1/2015 | Agrawal et al. | |

(Continued)

OTHER PUBLICATIONS

ISR and Written Opinion, PCT/CN2019/086359, dated Jan. 23, 2020.

*Primary Examiner* — Rexford N Barnie
*Assistant Examiner* — Elim Ortiz
(74) *Attorney, Agent, or Firm* — Stuart T. Auvinen; g Patent LLC

(57) ABSTRACT

A receiver is energized by wireless power from a coil antenna. A matching network tunes the receiver to a resonant frequency and a bridge and capacitor generate an output voltage. The output voltage is divided and compared to a reference voltage. An asynchronous digital controller increases a digital count when the compare result is true, but decreases the digital count when the compare result is false. A current-steering Digital-to-Analog Converter (DAC) shunts a current from the output that is a function of the digital count. The asynchronous digital controller, comparator, and DAC do not use a system clock, so the digital feedback to the shunt current operates when the target output voltage is reached, preventing over-voltage when waiting for the system clock to begin pulsing. The digital count is compared to a digital threshold to recover transmitted Amplitude-Shifted-Keyed (ASK) data.

20 Claims, 12 Drawing Sheets

(56) References Cited

U.S. PATENT DOCUMENTS

| | | |
|---|---|---|
| 2015/0380974 A1 | 12/2015 | Lin et al. |
| 2017/0047783 A1* | 2/2017 | Shevde ................ H04B 5/0037 |
| 2018/0091003 A1* | 3/2018 | Akahori ................ G11C 16/30 |
| 2018/0102674 A1* | 4/2018 | Hanabusa ......... H02M 3/33576 |

* cited by examiner

DIGITAL SHUNT REGULATION FOR A WIRELESS-POWER RECEIVER

FIELD OF THE INVENTION

This invention relates to wireless power receivers, and more particularly to digital shunt regulation of the wireless power being received.

BACKGROUND OF THE INVENTION

Energy can be transferred without wires to activate low-power systems. A small antenna or coil can be included in a remote system, and the electromagnetic power that is coupled from a nearby transmitter into this antenna is used to power the system or to charge a small battery. The power is transferred wirelessly by electromagnetic induction.

Small chips known as Radio-Frequency Identification (RFID) tags have been powered by electromagnetic induction. More recently, charging mats have been used to wirelessly charge a battery on a larger device such as a smartphone. Different physical mechanisms may be employed, depending on various factors such as the distance separating the transmitter and receiver.

Wireless power transfer may be enhanced by matching impedances of the transmitter and receiver antennas and using a resonant frequency. Such resonant wireless power transfer may provide for an extended range. Having an extended range may enable new applications, such as a Head-Mounted-Display (HMD) that projects 3D stereo images into a user's eyes. The 3D view changes as the user moves and tilts his head. Bulky wires to power current HMD can impede the user's movements. Thus a HMD that is wirelessly powered is highly desirable.

Other mobile devices could likewise benefit from wireless power transfer. Smaller Internet-of-Things (IoT) devices or appliances would likewise benefit from wireless power transfer.

FIG. 1 shows a prior-art resonant wireless-power transfer system. Wireless power receiver 100 receivers wireless power from wireless power transmitter 110. In wireless power transmitter 110, driving unit 116 provides power to amplifier 114 which generates AC signals that are filtered by matching unit 112 to drive antenna 118. The transmitted signal may be modulated by controller and communications unit 122. The coils, capacitors, or other filter elements in matching unit 112 attempt to match the impedance into antenna 118 with the output power from amplifier 114 to obtain a resonant frequency that receiver antenna 128 is tuned for.

The wireless signal received on receiver antenna 128 is rectified by rectifier 102 and regulated by DC-DC converter 104. Switching unit 106 connects the regulated voltage from DC-DC converter 104 to power loading unit 108 when wireless power is being received, but disconnects loading unit 108 when wireless power is not available. Controller and communications unit 120 detects communication signals received by receiver antenna 128 that are sent by controller and communications unit 122 in wireless power transmitter 110.

FIG. 2 is a waveform diagram illustrating a start-up delay in a hypothetical wireless-power receiver. The coil voltage V_COIL begins pulsing when the receiver's antenna begins to receive wireless signals from the transmitter. As these received signals become stronger, the voltage generated by the regulator, V_OUT, also rises. The target supply voltage of 5 volts is reached by V_OUT at 5 μsec, but the internal clock in the receiver CLK has not yet started pulsing due to start-up delays in the clock oscillator circuits or Phase-Locked Loops (PLL's). After another 5 μsec, the internal clock CLK begins pulsing.

Once the internal clock CLK begins pulsing, various digital circuitry also becomes operational. such as any Digital-to-Analog Converters (DACs). In particular, a digital input DIN to a DAC that controls a power shunt would begin to operate after 10 μsec when the clock begins pulsing. This power shunt that is controlled by DIN would begin to regulate voltage V_OUT, which had risen above the target of 5 volts because the clock was not pulsing until 10 μsec.

Some power regulators may not begin to operate immediately. Some regulators may rely upon digital logic that requires a clock, such as to sample voltages or operate state machines or sequencers/controllers. These kinds of regulators provide little or no voltage regulation during the start up period until the clock begins to pulse at 10 μsec. Without regulation, the coil voltage V_COIL and the received voltage V_OUT can rise above the 5 volt target.

Over-voltage can occur during this clock-start-up delay period from 5 μsec to 10 μsec. V_COIL and V_OUT can rise above the 5 volt target to as high as 8 volts in simulations. Regular transistors may sustain damage when subjected to 8 volts.

This initial over-voltage is undesirable, since circuit or device damage may occur. Specialized high-voltage devices may be required to prevent damage from this over-voltage. These high-voltage devices are undesirable since they tend to require a much larger die area than regular-voltage transistors. The large die area for these high-voltage devices increases cost and capacitive delays. These delays due to high-voltage protection devices may limit high-speed performance and increase critical feedback and loop delays in the circuit. Special non-standard complementary metal-oxide-semiconductor (CMOS) process steps may be needed to construct these high-voltage devices, which may further increase cost.

FIG. 3 is a waveform showing that a series regulator can cause high voltage when the load is switched. In the circuit of FIG. 1, DC-DC converter 104 is in series between rectifier 102 and loading unit 108. When the load driven by loading unit 108 suddenly changes, such as when circuit switching occurs, the load current may suddenly change. In the simulation of FIG. 3, I_LOAD is changed from 50 mA to 20 mA at 1 ms, and then back to 50 mA at 2 ms.

DC-DC converter 104 is able to maintain its output to switching unit 106 and to loading unit 108, V_OUT, at a fairly stable voltage despite this current switch. However, the input into DC-DC converter 104, VBRIDGE, rises suddenly with the load current change. This is because the sudden drop in current through receiver antenna 128 creates a back voltage to compensate, since receiver antenna 128 is an inductor. The inductance of receiver antenna 128 creates a voltage rise to compensate for the sudden change in current.

Thus the sudden drop in load current I_LOAD causes the voltage V_COIL across receiver antenna 128 to rise due to its inductance, and the rise in V_COIL passes through rectifier 102 to also increase VBRIDGE between rectifier 102 and the input to DC-DC converter 104.

The rise in voltage of V_COIL and VBRIDGE can be significant, such as a rise of 30-60 volts. These large voltages would require high-voltage devices, which require a larger die area and perhaps additional process steps, driving up the cost. Thus a series regulator such as shown in FIG. 1 is undesirable.

What is desired is a power shunt to avoid the high voltages that result from series regulation. A power shunt that is controlled by feedback is desired. It is desired to use digital logic in the feedback loop to the power shunt that does not require high-voltage devices. It is desired to have this digital logic in the feedback loop to be asynchronous so that there is no initial start-up delay while waiting for the clock to begin pulsing. A wireless-power receiver is desired that receives power wirelessly through a coil or antenna, and that regulates the wirelessly-received power using a power shunt with asynchronous digital feedback.

DETAILED DESCRIPTION

The present invention relates to an improvement in regulators for wireless power receivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
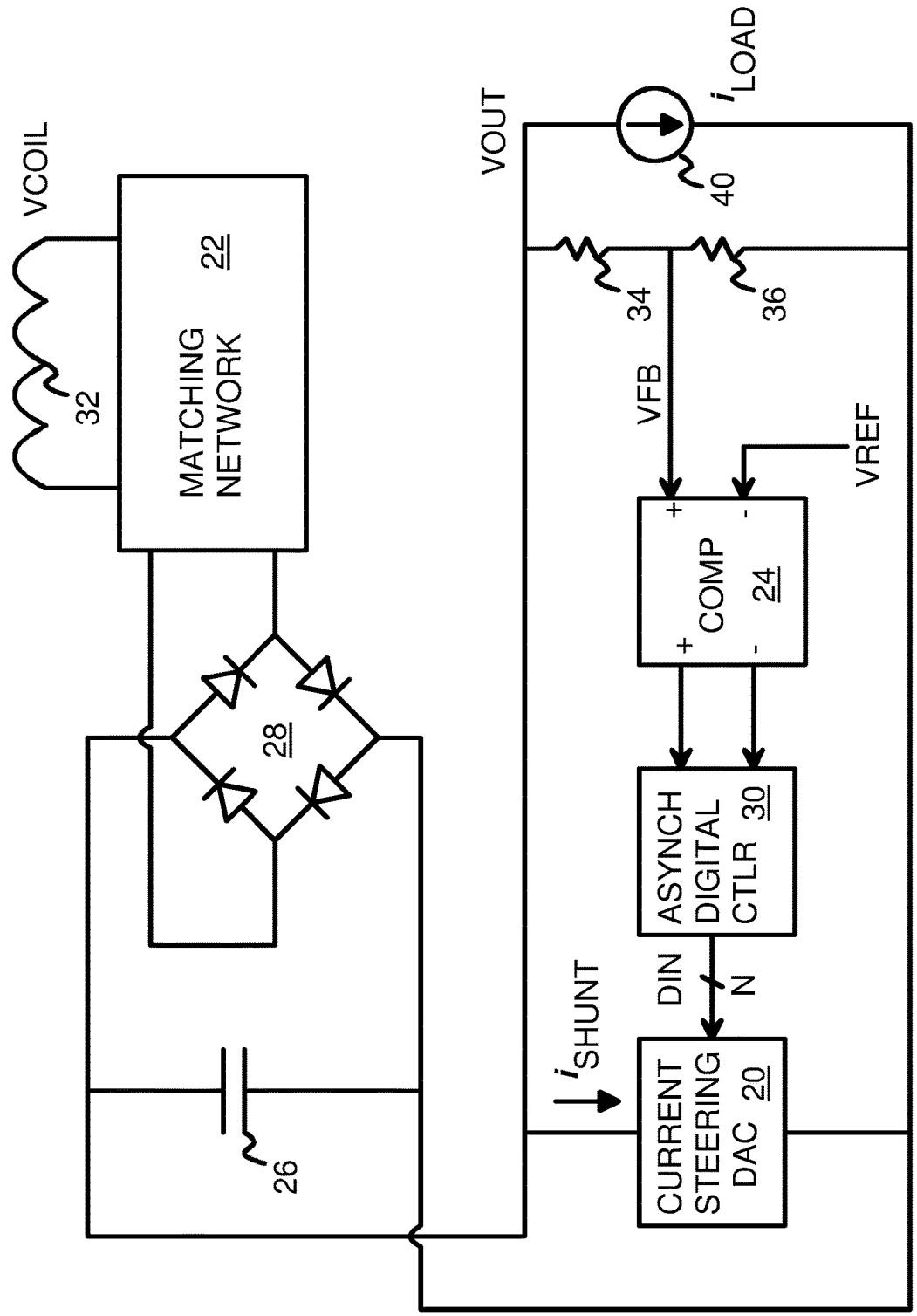
FIG. 4 is a diagram of a wireless-power receiver with asynchronous digital feedback to a power shunt.

FIG. 4 is a diagram of a wireless-power receiver with asynchronous digital feedback to a power shunt. Coil 32 acts as an antenna to receive electromagnetic signals from a transmitter. Matching network 22 has one or more capacitors, inductors, or other filter elements to tune the resonate frequency of the receiver to enhance the transfer efficiency of wireless power through coil 32.

Bridge 28 is a full-wave bridge of four diodes that receives the A.C. signals received by coil 32 and tuned by matching network 22 to generate D.C. signals. Capacitor 26 across the outputs of bridge 28 filters and smoothes the rectified quarter-wave signals to generate output voltage V_OUT to load 40. The second output terminal of bridge 28 can act as a ground.

When the load current through load 40 suddenly changes, such as during circuit switching during normal operation, large sudden changes to V_OUT are prevented by shunting current to ground. Shunt current $i_{SHUNT}$ flows through current steering DAC 20 to bypass load 40 and prevent large voltage spikes on V_OUT when changes in $i_{LOAD}$ occur.

Current steering DAC 20 uses a Digital-to-Analog Converter (DAC) to control the amount of shunt current $i_{SHUNT}$. The DAC receives a digital input DIN having N binary bits. No clock is needed for operation of current steering DAC 20.

A feedback voltage VFB is generated between resistors 34, 36 that are connected from V_OUT to ground. Comparator 24 compares feedback voltage VFB to a reference voltage VREF to drive + and − outputs. When VFB is greater than VREF, + is driven high and − is driven low, while when VFB is less than VREF, − is driven high and + is driven low.

Asynchronous digital controller 30 examines the + and − outputs of comparator 24 and increases the digital value of DIN when the + output is high, and decreases the digital value of DIN when the − output is high. Asynchronous digital controller 30 is not clocked. Instead, asynchronous digital controller 30 can be activated by the rising edge of the + output or by the rising edge of the − output. Asynchronous digital controller 30 can have a self-timing delay such as a pulse generator to determine how often it examines the outputs of comparator 24. The speed that asynchronous digital controller 30 increases or decreases DIN could be set during design or could be programmable, such as to match the feedback loop response time. Comparator 24 could also be reset by asynchronous digital controller 30 to control the feedback detection frequency.

Since no clock is needed by comparator 24, asynchronous digital controller 30, or current steering DAC 20, the feedback loop begins operation without a delay due to the start-up of the local system clock. Since feedback can begin operating as V_OUT is rising past the target voltage, over-voltage can be avoided. Current can be shunt through current steering DAC 20 once V_OUT passes the target voltage, without waiting for the clock to initialize. Thus over-voltage is avoided, and high-voltage transistors and other devices are not needed.

Figure 5:
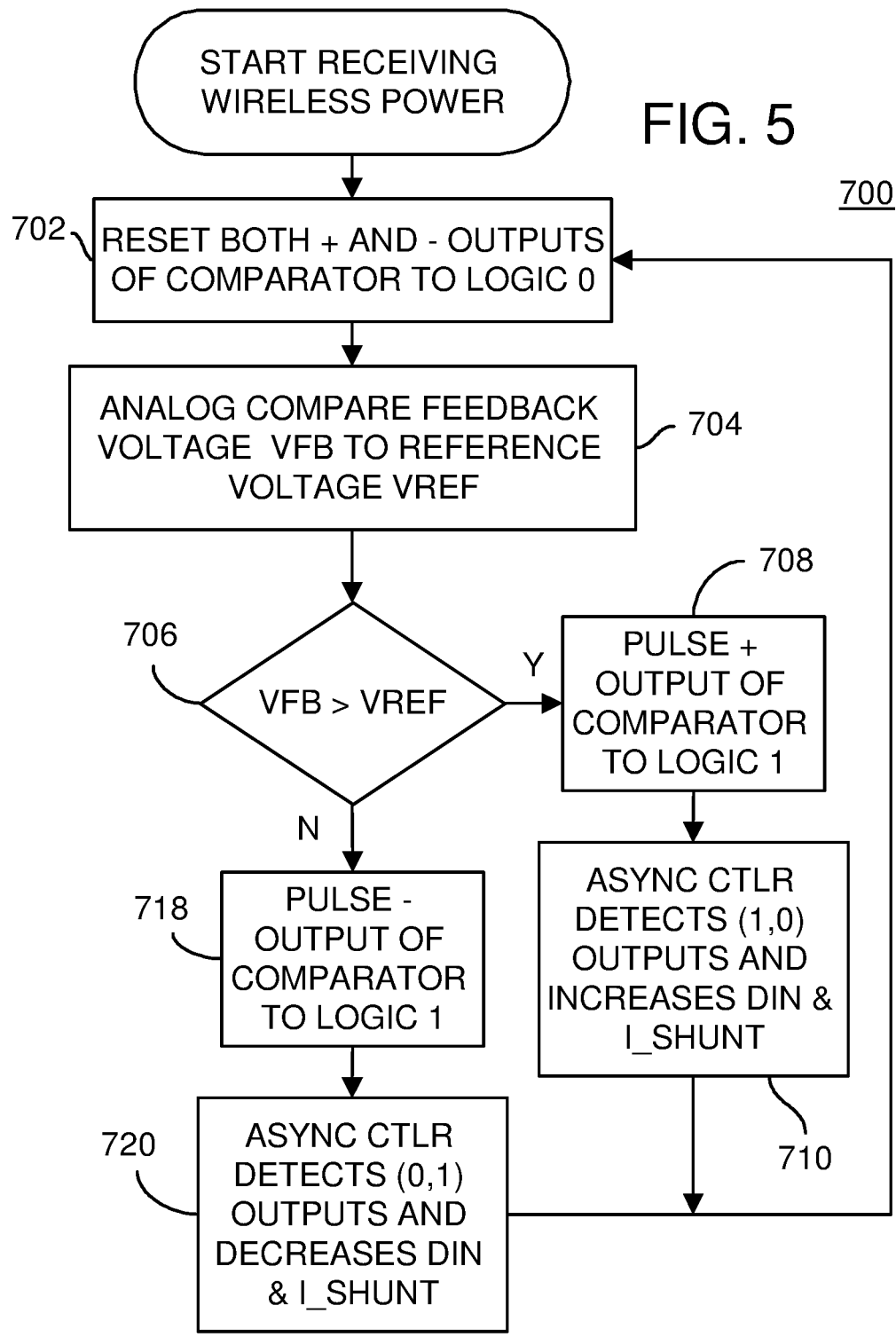
FIG. 5 is a flowchart of asynchronous operation of the digital feedback loop.

FIG. 5 is a flowchart of asynchronous operation of the digital feedback loop. When the wireless receiver starts receiving wireless power, feedback routine 700 initiates. Both the + and − outputs of comparator 24 are reset to zero, step 702. For example, comparator 24 can be precharged into a state with both outputs low for step 702, such as by driving a disabling voltage onto the gates of current-source transistors in a first stage of a differential amplifier. The reset control to comparator 24 can be pulsed on for a short time period for step 704 such as by an asynchronous one-shot pulse generator.

Once comparator 24 has been reset, step 702, then comparator 24 compares the input voltages VFB and VREF, step 704. When VFB is greater than VREF, step 706, comparator 24 pulses the + output high while leaving the − output low, step 708. Asynchronous digital controller 30 then detects the high pulse on the + output while the − output is low, and increases the digital value of DIN, step 710. The higher DIN value causes current steering DAC 20 to increase the shunt current. The comparator can then be reset, step 702, and another process loop can begin.

When VFB is less than VREF, step 706, comparator 24 pulses the − output high while leaving the + output low, step 718. Asynchronous digital controller 30 then detects the high pulse on the − output while the + output is low, and decreases the digital value of DIN, step 720. The lower DIN value causes current steering DAC 20 to decrease the shunt current. The comparator can then be reset, step 702, and another loop can begin.

A system clock is not needed to implement feedback routine 700. Timing can be controlled by inherent circuit delays and any added delay elements such as delay lines or R-C delays. Although digital logic is used, the digital feedback operates without a system clock and can begin controlling the shunt current before the system clock begins pulsing.

Figure 6:
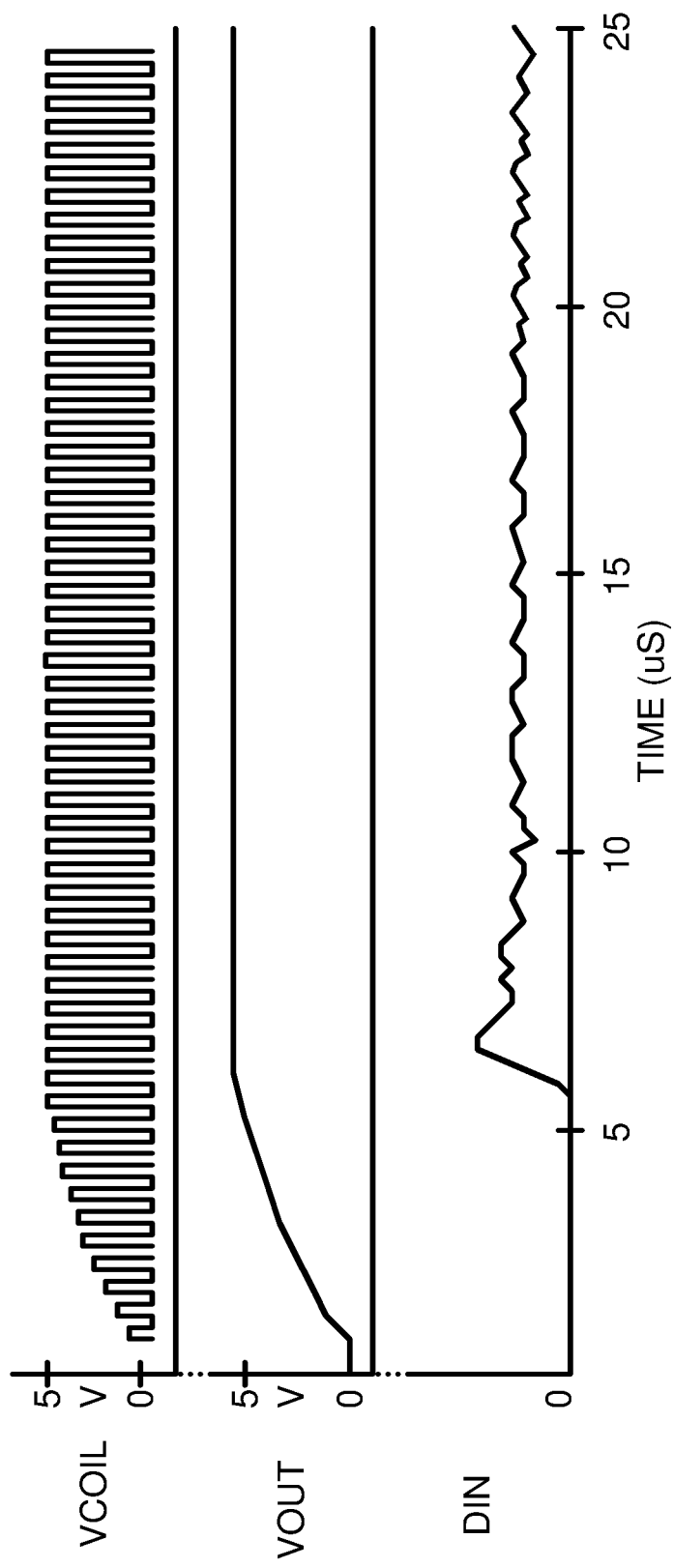
FIG. 6 is a waveform of start-up operation of the wireless-power receiver of FIG. 4.

FIG. 6 is a waveform of start-up operation of the wireless-power receiver of FIG. 5. When coil 32 begins to receive an A.C. wireless signal from the transmitter, the coil voltage V_COIL begins pulsing and the pulse amplitude increases over time. As the amplitude of V_COIL increases, capacitor 26 is charged through bridge 28, causing V_OUT to rise. Once V_OUT reaches its target voltage, such as 5 volts, most circuitry can operate properly. In particular, the reference voltage VREF is established as V_OUT rises and activates the bandgap circuit, and feedback voltage VFB rises as VOUT rises. Once VFB rises above VREF, comparator 24 can activate asynchronous digital controller 30 to begin adjusting DIN from an initial value such as 0. The higher DIN values cause current steering DAC 20 to begin shunting current, eventually causing V_OUT to fall. Some back and forth of DIN and V_OUT can occur as the circuit settles. Then DIN is adjusted as needed to respond to changes in V_OUT to maintain V_OUT at its target value.

The time delay until current shunt begins depends on the slew rate of V_OUT. In this example, the delay is about 5 μsec, but faster or slower slew rates would cause the delay to track V_OUT's slew. Over-voltage does not occur, since the feedback's operation depends not on timing, but on the voltage level of V_OUT. Thus over-voltage is inherently prevented.

Figure 7:
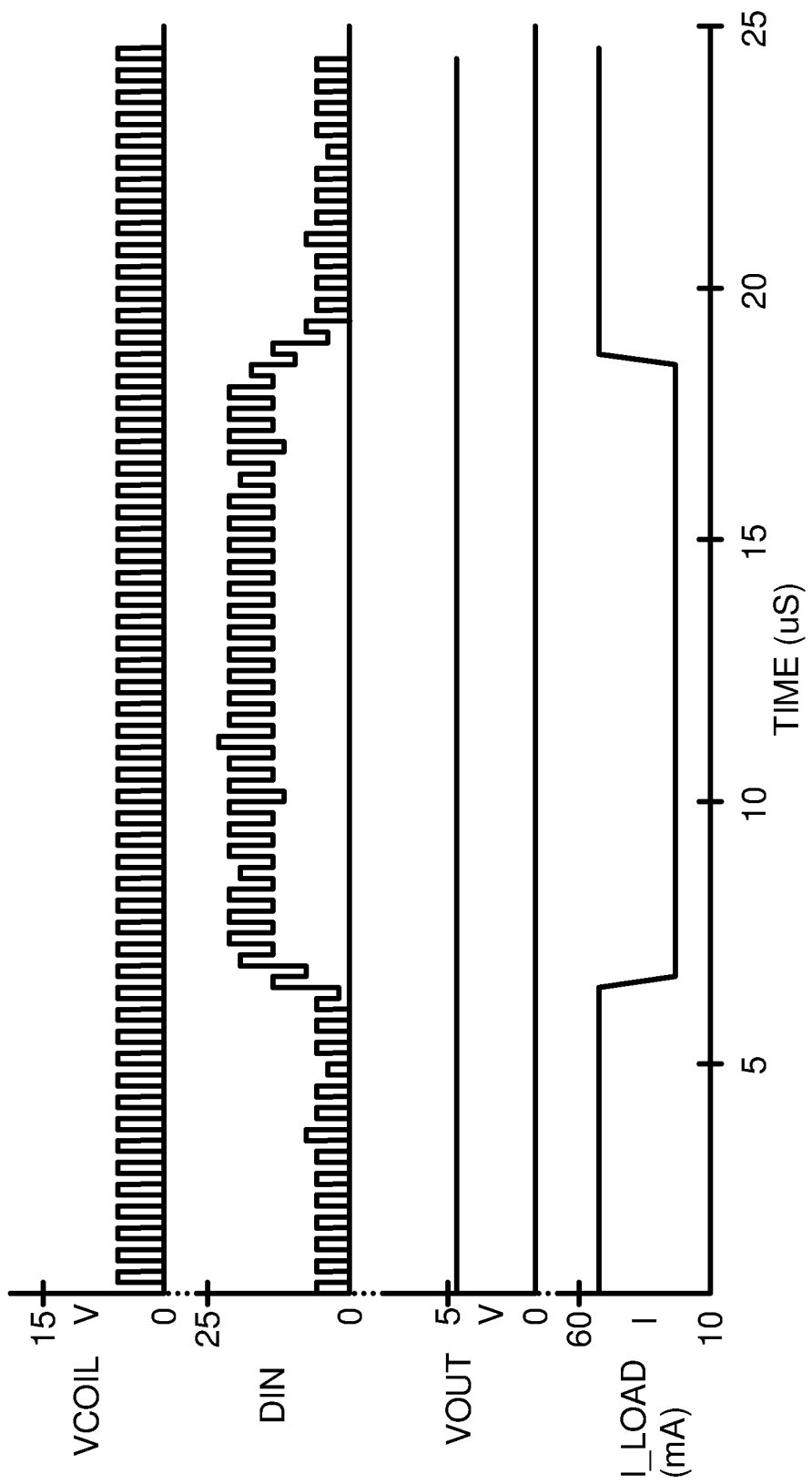
FIG. 7 is a waveform of the load-switching performance of the wireless-power receiver of FIG. 4.

FIG. 7 is a waveform of the load-switching performance of the wireless-power receiver of FIG. 5. When the load current through load 40 is suddenly switched from 50 mA to 20 mA at 7 μsec, the output voltage V_OUT is maintained by current steering DAC 20 shunting more current as the feedback loop increases the digital value of DIN. DIN may appear to pulse when capacitor 26 has a small capacitance and VOUT ripples with the A.C. transmitted signal, or DIN may be smoother when larger capacitance values are used to smooth the ripples.

The increased shunt current allows the coil voltage V_COIL to remain with a relatively constant amplitude. Thus load switching does not cause over-voltage on coil 32, matching network 22, or on bridge 28 or related circuits. Lower-cost devices made by a standard CMOS process can be used.

Figure 8:
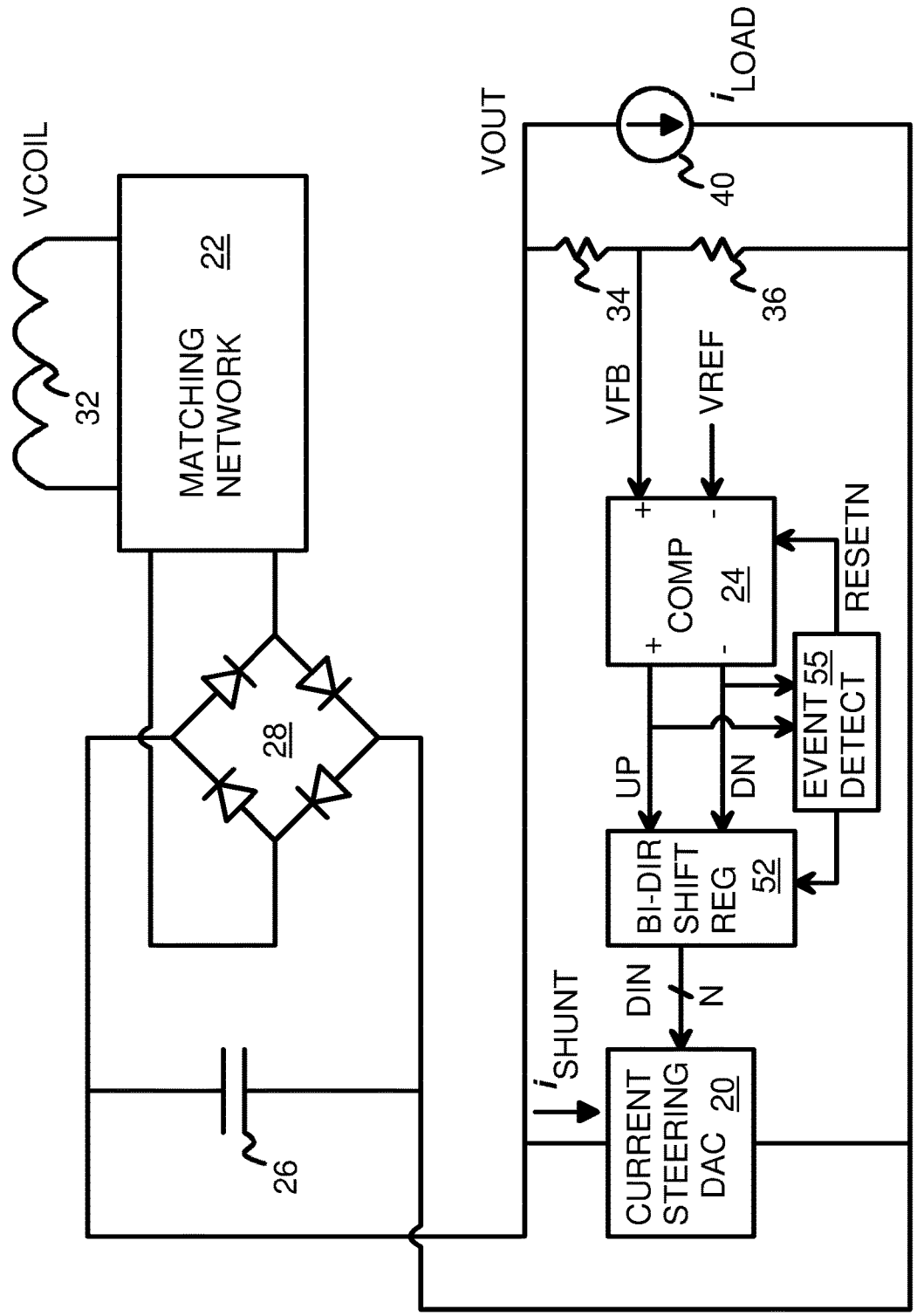
FIG. 8 is a wireless-power receiver using a bi-directional shift register in the digital feedback path.

FIG. 8 is a wireless-power receiver using a bi-directional shift register in the digital feedback path. In this alternative, asynchronous digital controller 30 is implemented as bi-directional shift register 52. When event detector 55 detects that either the + or − compare output from comparator 24 is high, it signals bi-directional shift register 52 to shift. Bi-directional shift register 52 shifts up if the + compare output is high, or shifts down if the − compare output is high. The contents of bi-directional shift register 52 can be encoded to generate an N-bit binary digital value for DIN. Once the new value of DIN has been generated by bi-directional shift register 52, event detector 55 pulses reset signal RESETN low to reset the compare outputs of comparator 24.

Figure 9:
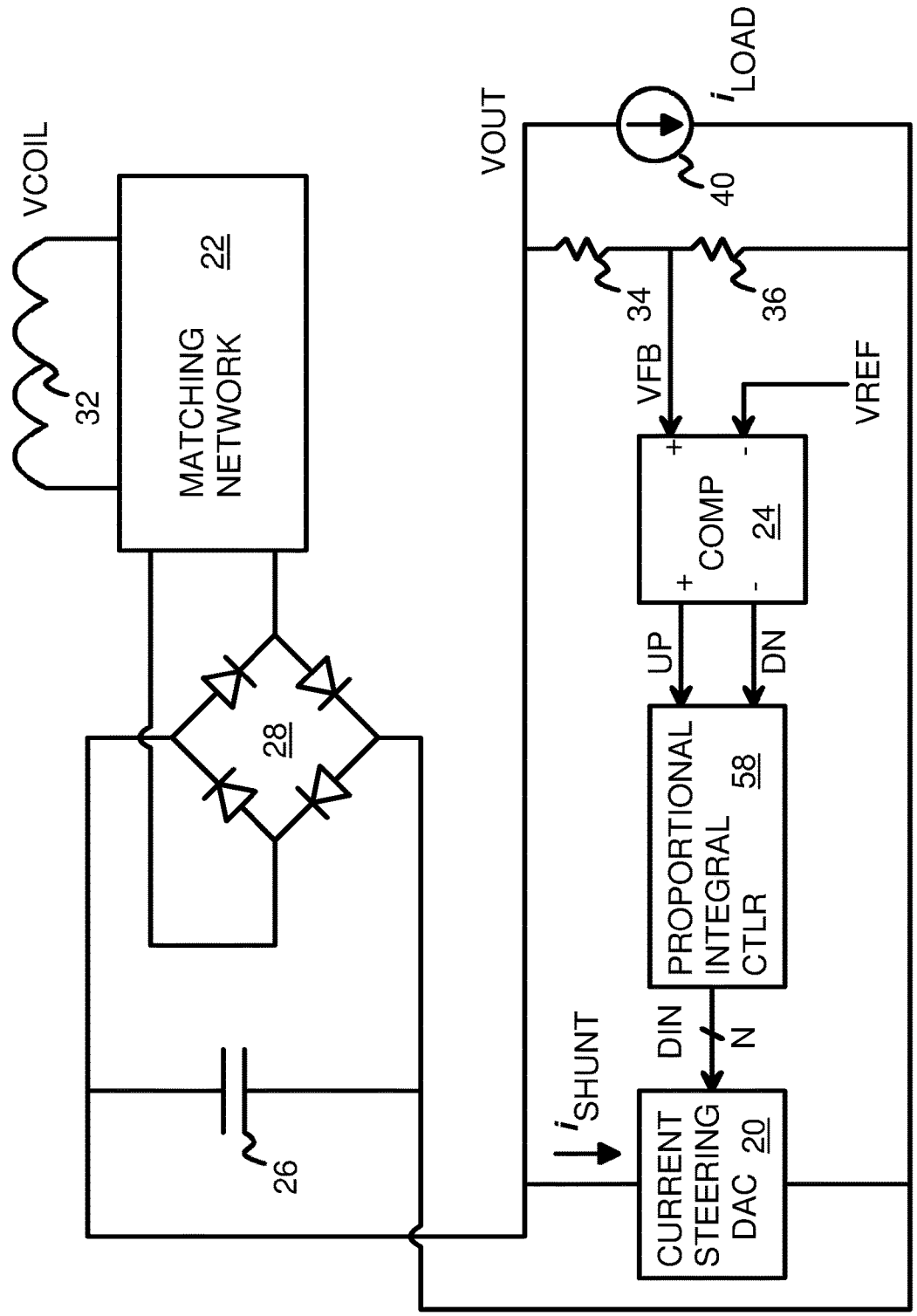
FIG. 9 is a wireless-power receiver using a proportional-integrator for the digital feedback.

FIG. 9 is a wireless-power receiver using a proportional-integrator for the digital feedback. In this alternative, proportional-integral controller 58 is used to implement asynchronous digital controller 30. Proportional-integral controller 58 can be triggered by event detector 55 (not shown), or may detect when the compare outputs of comparator 24 change, and then adjust the digital value DIN. New adjustment to DIN are integrated with prior changes to DIN by proportional-integral controller 58.

Figure 10:
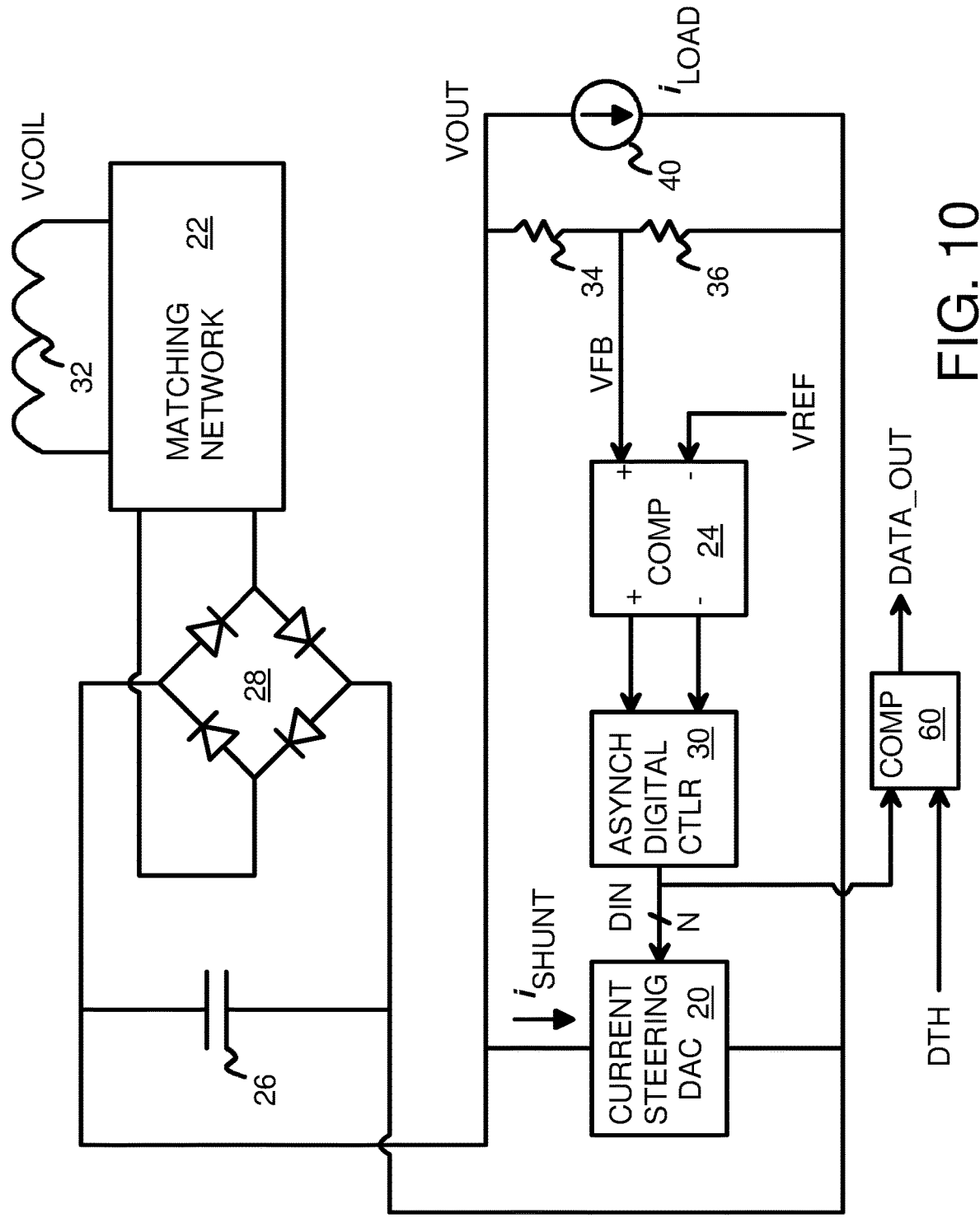
FIG. 10 is a diagram of a wireless-power receiver with an asynchronous digital shunt that is modified to receive transmitted data.

FIG. 10 is a diagram of a wireless-power receiver with an asynchronous digital shunt that is modified to receive transmitted data. In this alternative, the transmitter encodes data by modulating the transmitted signals using Amplitude-Shifted-Keying (ASK). The ASK-modulated signal received by coil 32 will have periods of time with higher transmitted power and other periods of time with lower transmitted power.

Normally, the coil voltage V_COIL would increase in amplitude when a higher transmitted power is received, and decrease in amplitude during the lower-transmitted power times. However, the digital feedback increases the shunt current through current steering DAC 20 during the high-power periods, and decreases the shunt current during low-power periods to maintain V_OUT at a nearly constant value. The constant V_OUT causes V_COIL to also remain relatively constant, while the current through coil 32 increases and decreases as transmitted power is modulated higher and lower by the transmitter.

During the higher-power time periods, the feedback loop will increase DIN to a high value DIN_H that is sufficiently high to cause current steering DAC 20 to increase the shunt current enough to keep V_OUT constant. Similarly, during the lower-power time periods, the feedback loop will decrease DIN to a low value DIN_L that is sufficiently low to cause current steering DAC 20 to reduce the shunt current enough to keep V_OUT constant at the target voltage for the internal power supply. If the transmitter modulates between just two power levels, then DIN will also tend to modulate between two levels, DIN_H and DIN_L. A midpoint value of DIN that is between DIN_H and DIN_L can be selected as a threshold DIN value DTH.

Digital comparator 60 can compare the current value of DIN generated by asynchronous digital controller 30 to this threshold value DTH. When the current DIN value is above threshold DTH, then a logic high (1) is detected. When the current DIN value is below threshold DTH, then a logic low (0) is detected. Digital comparator 60 can thus output the recovered data DATA_OUT as the received data stream.

Figure 11:
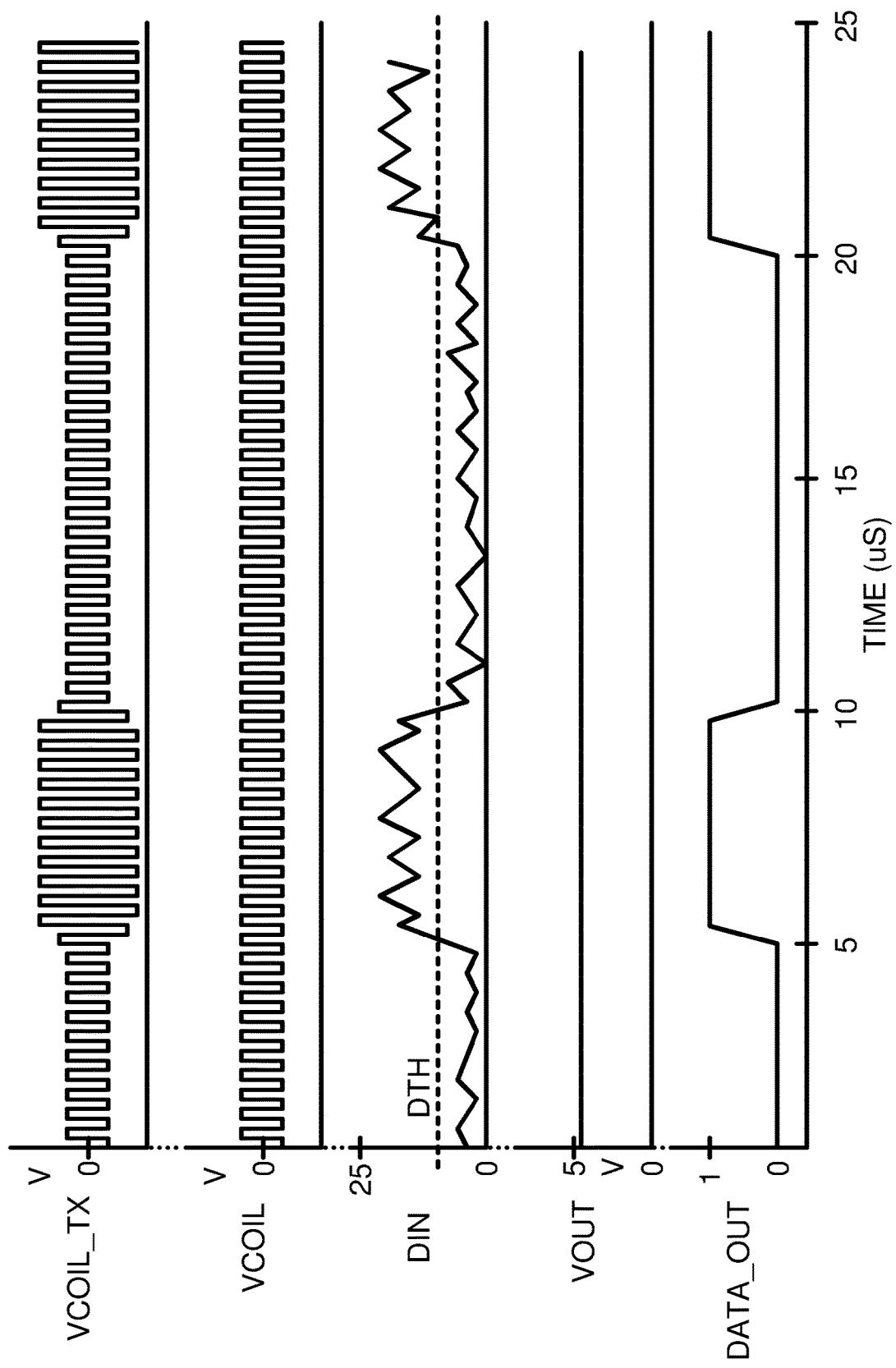
FIG. 11 is a waveform showing data recovery from a modulated wireless power transmission.

FIG. 11 is a waveform showing data recovery from a modulated wireless power transmission. The wireless transmitter not only sends power wirelessly to the receiver that is used to power the receiver, but also encodes data into the transmitted power. The transmitter uses ASK modulation to modulate the transmitted signal among two power levels with different amplitudes. For a logic 0, the transmitted power and amplitude are reduced, while for a logic 1, the transmitted power amplitude are increased.

The transmitter's coil voltage, V_COIL_TX, has periods of lower amplitude pulses and periods of higher amplitude pulses. However, the receiver's coil voltage, V_COIL, has a constant amplitude, since the feedback loop increases and decreases the shunt current to maintain V_OUT at a constant voltage, preventing V_COIL from rising or falling in amplitude with the transmitted power modulations. Instead, the shunt current rises and falls to compensate for the power modulations. The feedback loop adjusts the shunt current by changing the DAC input DIN, modulating DIN between a high value, DIN_H, when the transmitter is using high power to send a logic 1, and a low value, DIN_L, when the transmitter is using low power to send a logic 0.

When DIN is above the threshold DTH, a logic 1 is detected, and comparator 60 outputs DATA_OUT high. When DIN is below the threshold DTH, a logic 0 is detected, and comparator 60 outputs DATA_OUT low. Thus the ASK encoded data is recovered by examining the digital input DIN to the DAC in the feedback loop.

DIN does not have to have stable and constant values, but merely has to be above or below the threshold DTH for data to be detected. DIN may fluctuate with loop jitter and noise. When capacitor 26 is small, and the feedback loop is quick, the A.C waveform may be super-imposed on DIN, causing DIN to periodically fluctuate.

Figure 12:
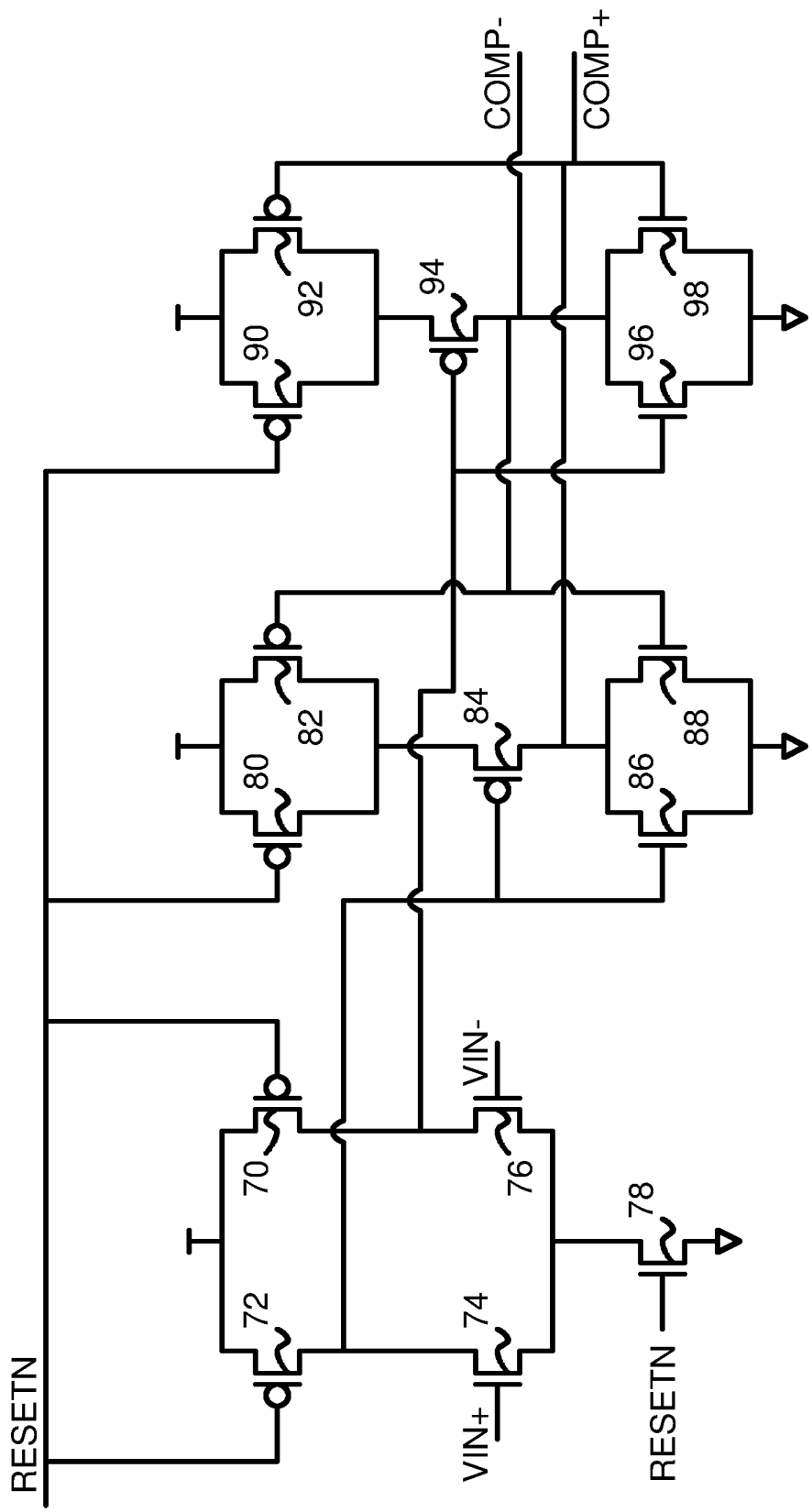
FIG. 12 is a schematic of a resetable comparator.

FIG. 12 is a schematic of a resetable comparator. Comparator 24 compares input voltages VIN+, VIN−, which could be VFB and VREF, to generate compare outputs COMP+, COMP−. RESETN is normally high but is pulsed low to reset comparator 24. When RESETN is pulsed low, n-channel transistor 78 turns off the first stage, and p-channel transistors 70, 72, 80, 90 turn on strongly, pulling high the gates of p-channel transistors 84, 94, shutting them off, and allowing both COMP+ and COMP− to be pulled low through n-channel transistors 86, 96.

During normal operation, RESETN is high, and n-channel transistor 78 is turned on, allowing the input voltages on the gates of n-channel transistors 74, 76 to be compared. The first stage outputs are inverted by p-channel transistor 84 and n-channel transistor 86 in the middle stage, and by p-channel transistor 94 and n-channel transistor 96 in the third stage. A latch is formed by p-channel transistor 82 and n-channel transistor 88 in the middle stage, which have gates driven by COMP−, and p-channel transistor 92 and n-channel transistor 98 in the third stage, which have gates driven by COMP+.

ALTERNATE EMBODIMENTS

Several other embodiments are contemplated by the inventors. For example the wireless-power receiver may be used for a variety of applications, such as energy harvesting, Radio-Frequency Identification (RFID) tags, Radio-Frequency (RF) powered systems, piezoelectric energy harvesting, wind energy harvesting, of other A.C. power sources.

Figure 2:
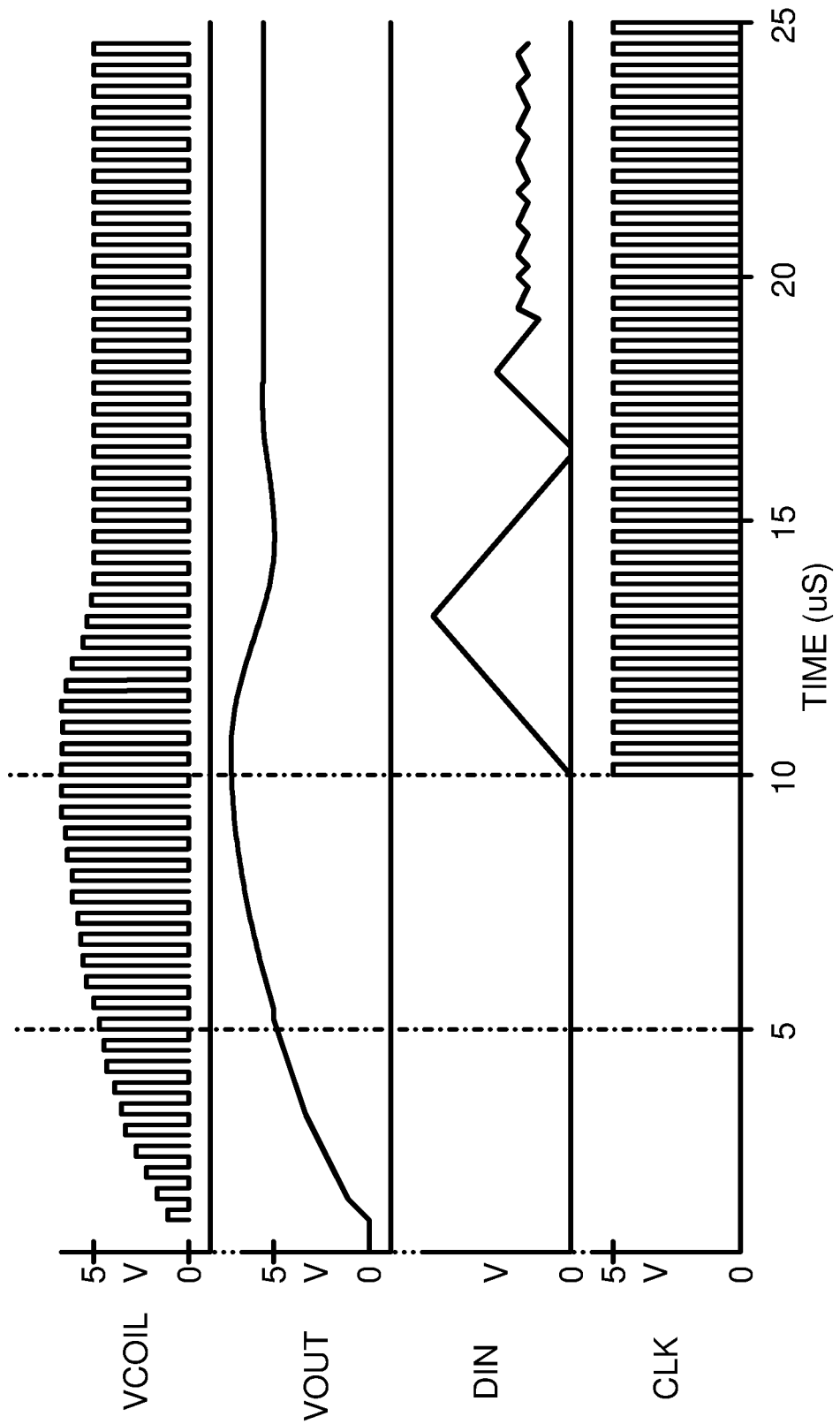
FIG. 2 is a waveform diagram illustrating a start-up delay in a hypothetical wireless-power receiver.
Figure 3:
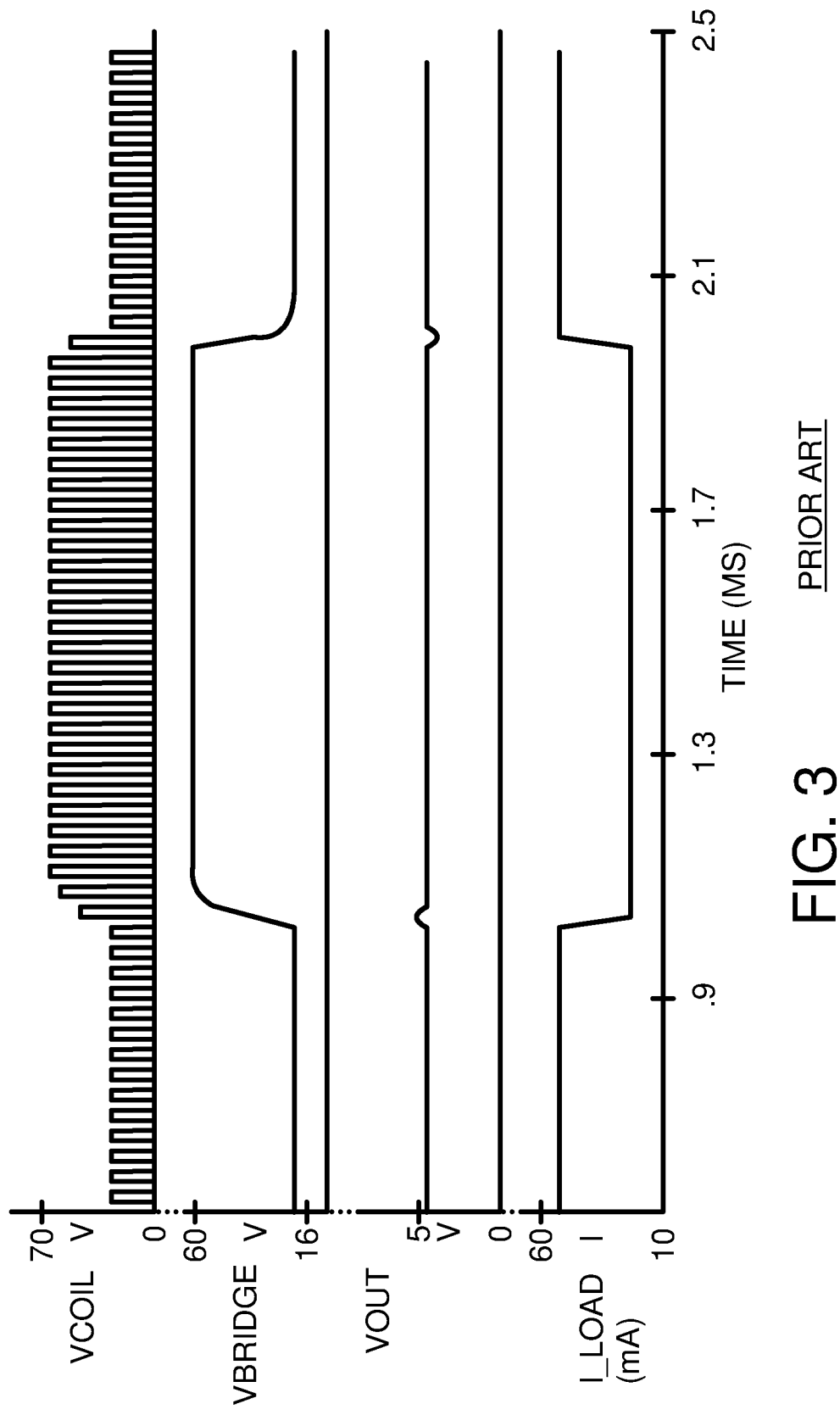
FIG. 3 is a waveform showing that a series regulator can cause high voltage when the load is switched.

FIGS. 2-3 show simulations for a proposed design rather than any particular prior art systems. The inventors are speculating on how the inventors' proposed modifications of prior-art systems would behave for a new proposed design based on the inventors' simulations. The time periods, such as 5 μsec and 10 μsec, could vary for different systems and are estimates only. The target voltage could be a voltage other than 5 volts, such as 3 volts, 1.8 volt, etc.

The reference voltage VREF can be generated by a bandgap reference voltage generator. Once the system is powered up to near the target voltage, the bandgap reference generator is relatively insensitive to fluctuations in the power-supply voltage such as V_OUT. For example, fluctuations of +/−10% of the target voltage do not change VREF more than 1%.

Figure 1:
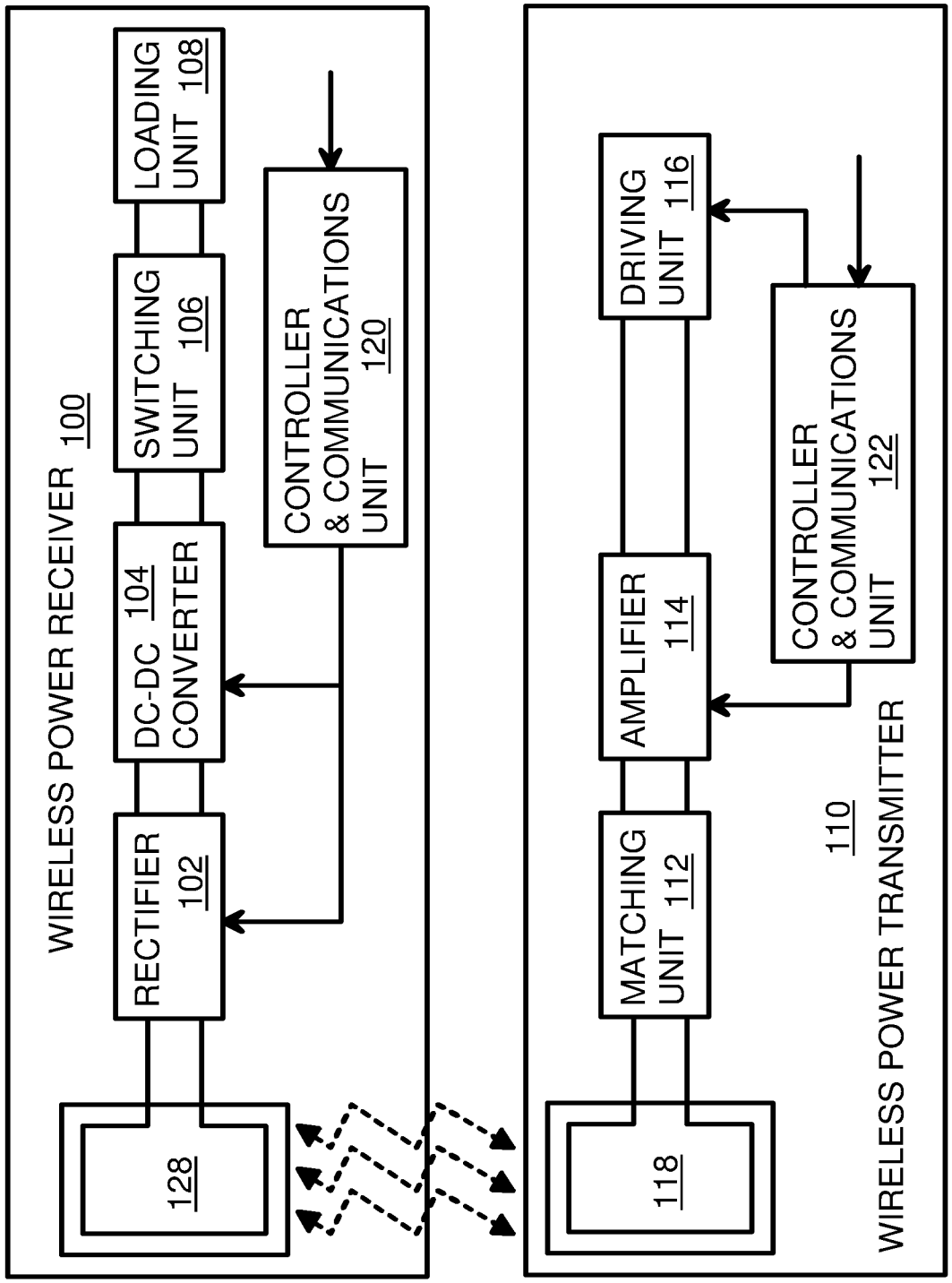
FIG. 1 shows a prior-art resonant wireless-power transfer system.

Coil 32 can be a simple antenna, such as a single loop or open ring. Many variations in the geometry of coil 32 are possible. Coil 32 can be a flat ring structure with an opening or cutout of the ring when the coil outputs are connected to the matching network, such as the geometry shown for coil antennas 118, 128 in FIG. 1. The geometry and size of the transmitter's antenna can be much larger and different in shape than the receiver antenna. There may be multiple transmitters in some systems.

The matching network may allow for adjustment of the impedance during system operation, or may be pre-tuned to a fixed impedance that best matches the expected resonant frequency and power.

The responsiveness of the feedback loop in FIG. 4 depends on how fast comparator 24 can compare voltages and be reset, and how fast asynchronous digital controller 30 and current steering DAC 20 can adjust the shunt current, as well as the size of the shunt current adjustments and the size of capacitor 26. Asynchronous digital controller 30 can increment or decrement DIN by 1, or by a larger amount such as 2, 5, 10, etc., for faster shunt current adjustments, along with more likelihood of control-loop overshoots. The time period that comparator 24 remains in the reset state can be adjusted by the delay line in a one-shot generating the reset pulse, or by similar methods.

While simple ASK modulation has been shown, other kinds of data modulation may be used. In particular, while just two power levels have been shown, with a single threshold DTH used to distinguish between two power levels, multi-bit symbols could be transmitted rather than binary bits, and the transmitter may transmit using more than 2 power levels. Multiple thresholds could be used by more than one comparator 60 in the receiver to distinguish among the multiple power levels.

The load may be considered to be connected from V_OUT to ground, where V_OUT and ground are terminals of the bridge. This bridge ground could be a same ground as used by all circuitry in the load, or multiple grounds could be used.

The waveforms have shown individual pulses of the transmitted A.C. waveform that is received by coil 32. However, the A.C. frequency may be much higher, and in an actual waveform seen on test equipment, the pulses may blur together. The waveforms seen on test equipment or in simulations may thus appear different than the idealized waveforms shown. The waveform drawings have used a very slow clock for easier illustration of the operating concepts.

Other components could be added, such as for powering down or turning off the receiver, even when transmitted power is being received, such as when a user flips off and on/off switch. A switching unit could be added to disconnect the output voltage from the load. A battery or capacitor could be added to continue to provide power and maintain the output voltage when the transmitted power is lost, perhaps extending power momentarily until a power-down routine can execute and save any data or settings. Smaller systems may not use a battery at all, and some applications may not be sensitive to power interruption and not have a need for a battery. The size of capacitor 26 could be enlarged to increase the time that V_OUT remains high to power the system after transmitted power is lost. Capacitor 26 could have a smaller capacitance value when ripples in V_OUT are well-tolerated, or a larger value to better smooth out ripples and noise. Capacitor 26 could be deleted in some low-cost applications where parasitic capacitances are sufficient. Rather than a full-rectifier bridge, a half bridge could be used.

The number of bits (N) in the digital value can be 3 bits, 4 bits, 8 bits, or some other value, depending on the precision of the shunt current that is desired for the control loop. Only the upper or Most-Significant-Bits (MSBs) of the DAC could be used, while the LSBs are drive low. A standard DAC layout could be used, with the less-significant current sources deleted from the final layout. The size of the least-significant current source in the DAC could be scaled up to the desired minimum adjustment of the shunt current.

The shunt current could be pulsed on and off rather than be on continuously. Asynchronous digital controller 30 could drive the digital value for only a short period of time after a compare event is detected, and then drive the digital value to all zeros to turn off the shunt current.

The schematic shown in FIG. 12 is just one possible embodiment of a resetable comparator. Comparator 24 could be a standard analog comparator with a single output, and asynchronous digital controller 30 could examine this comparator output and increase DIN when this output is high, and decrease DIN when this output is low. Event detector 55 or another edge detector or self-timer could detect changes on the one input to trigger asynchronous digital controller 30 to increase or decrease DIN. A one-shot pulse generator could be triggered when the compare output changes state, and this one-shot pulse could trigger a cascade of operations in asynchronous digital controller 30 including pulsing RESETN low to reset the comparator if a resetable comparator is used. Many possible arrangements and alternatives are contemplated for asynchronous digital controller 30, with and without event detector 55 or another trigger or self-timing circuit, and with a standard comparator 24 or a resetable comparator 24.

Inversions may be added by swapping inverting and non-inverting inputs as desired, but do not change the overall function and thus may be considered equivalents. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit or powering down blocks could be accomplished with additional transistors or in other ways. Pass-gate transistors or transmission gates could be added for isolation. While differential logic has been shown, single-ended signals could be used with a fixed voltage such as ground for the complement differential signals, or just the true differential path could be used. Currents could be considered positive or negative, and voltages may be relative to various reference levels rather than absolute.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A wireless-power receiver comprising:
an antenna for receiving transmitted power;
a matching network connected to the antenna to match impedances;
a bridge to rectify the transmitted power received by the antenna, the bridge having two inputs from the matching network, and having an output terminal and a ground terminal;
wherein the transmitted power energizes a load that is connected between the output terminal and the ground terminal;
a Digital-to-Analog Converter (DAC), receiving a digital value, for generating a shunt current from the output terminal to the ground terminal, wherein the shunt current is a function of the digital value;
a feedback divider that receives an output voltage of the output terminal, and divides the output voltage by a ratio to generate a feedback voltage;
a comparator that compares the feedback voltage to a reference voltage to generate a compare output; and
an asynchronous digital controller that is activated by the compare output, the asynchronous digital controller increasing the digital value when the compare output is in a first logical state, the asynchronous digital controller decreasing the digital value when the compare output is in a second logical state,
whereby the output voltage is regulated by digital feedback that controls the shunt current.

2. The wireless-power receiver of claim 1 wherein the asynchronous digital controller is not clocked by a system clock, the asynchronous digital controller being activated by changes in the compare output;
wherein the asynchronous digital controller operates to control the shunt current when the system clock is not yet pulsing during power-up.

3. The wireless-power receiver of claim 2 further comprising:
a bandgap reference generator that generates the reference voltage,
wherein the reference voltage generated is relatively insensitive to fluctuations of the output voltage.

4. The wireless-power receiver of claim 1 wherein the feedback divider comprises:
a first resistor connected between the output terminal and a first input to the comparator; and a second resistor connected between the first input to the comparator and the ground terminal;

wherein the feedback voltage is generated on the first input to the comparator;

wherein the reference voltage is applied to a second input to the comparator.

5. The wireless-power receiver of claim 1 wherein the shunt current is proportional to the digital value.

6. The wireless-power receiver of claim 1 wherein the digital value is a binary value;

wherein the DAC comprises a plurality of current sources generating binary-weighted currents, wherein successively-larger bits of the digital value control current sources in the plurality of current sources having successively-larger binary-weighted currents.

7. The wireless-power receiver of claim 6 wherein the digital value is a binary value having at least 3 binary bits.

8. The wireless-power receiver of claim 1 wherein the matching network sets an impedance to the antenna to tune the antenna to a resonant frequency, the resonant frequency being used by a transmitter that generates the transmitted power received by the antenna, whereby resonant wireless power transfer occurs between the transmitter and the wireless-power receiver.

9. The wireless-power receiver of claim 1 further comprising:

a reset signal that is pulsed on by the asynchronous digital controller after the asynchronous digital controller has increased or decreased the digital value;

wherein the comparator receives the reset signal, the comparator resetting the compare output in response to the reset signal being pulsed on by the asynchronous digital controller.

10. The wireless-power receiver of claim 9 wherein the compare output from the comparator further comprises a first compare output and a second compare output;

wherein comparator sets the first compare output into a high logic state when the feedback voltage is greater than the reference voltage;

wherein comparator sets the second compare output into the high logic state when the feedback voltage is less than the reference voltage;

wherein comparator resets the first compare output into a low logic state and resets the second compare output into the low logic state in response to the reset signal.

11. The wireless-power receiver of claim 10 further comprising:

a capacitor connected between the output terminal and the ground terminal.

12. The wireless-power receiver of claim 11 wherein the asynchronous digital controller further comprises:

a proportional integral controller that integrates the compare output to generate the digital value.

13. The wireless-power receiver of claim 11 wherein the asynchronous digital controller further comprises:

a bi-directional shift register that shifts up in response to the compare output being in the first logical state to increase the digital value, and shifts down in response to the compare output being in the second logical state to decrease the digital value.

14. The wireless-power receiver of claim 11 further comprising:

a digital comparator that compares the digital value from the asynchronous digital controller to a digital threshold, the digital comparator driving a data signal high when the digital value is above the digital threshold, the digital comparator driving the data signal low when the digital value is below the digital threshold;

wherein a transmitter encodes data by modulating the transmitted power;

wherein the data signal is recovered data that corresponds to the data encoded by the transmitter.

15. The wireless-power receiver of claim 14 wherein the transmitted power is modulated to carry Amplitude-Shifted-Keyed (ASK) encoded data from the transmitter.

16. A self-powered receiver comprising:

an antenna for receiving electromagnetic signals from a transmitter;

a bridge for converting alternating electromagnetic signals received by the antenna to an output voltage on a first output, the output voltage relative to a ground connected to a second output of the bridge;

a voltage divider that receives the output voltage and generates a feedback voltage that is less than the output voltage;

a comparator that compares the feedback voltage to a reference voltage to generate a compare output;

an asynchronous digital controller that increases a digital value when the comparator generates the compare output in a first state, and decreases the digital value when the comparator generates the compare output in a second state; and a Digital-to-Analog Converter (DAC) that generates a variable shunt current that increases with increases in the digital value;

wherein the DAC is connected to conduct the variable shunt current from the first output of the bridge to the second output of the bridge, the DAC receiving the digital value from the asynchronous digital controller;

wherein digital feedback to the DAC is provided by the asynchronous digital controller from the compare output during an initialization period when a system clock has not yet started pulsing due to an initialization delay for the system clock upon power-up.

17. The self-powered receiver of claim 16 further comprising:

a digital comparator that compares the digital value from the asynchronous digital controller to a digital threshold, the digital comparator driving a data signal into a first logic state when the digital value is above the digital threshold, the digital comparator driving the data signal into a second logic state when the digital value is below the digital threshold;

wherein data is encoded by a transmitter that modulates transmitted power;

wherein the data signal is recovered data that corresponds to the data encoded by the transmitter;

wherein the transmitted power is modulated to carry Amplitude-Shifted-Keyed (ASK) encoded data from the transmitter.

18. The self-powered receiver of claim 17 further comprising:

an impedance-matching network, coupled to the antenna, for tuning to a resonant frequency of the transmitter.

19. A digital regulator for a wireless-power receiver comprising:

a voltage divider that receives an output voltage on an output node and generates a feedback voltage;

wherein the output voltage is for use as an internal power-supply voltage for a load circuit;

a comparator that compares the feedback voltage to a reference voltage to generate a compare output;

an asynchronous digital controller that increases a digital value in response to the compare output indicating that the feedback voltage is above the reference voltage, and that decreases the digital value in response to the compare output indicating that the feedback voltage is below the reference voltage;

wherein the asynchronous digital controller increases and decreases the digital value without regard to a system clock, the asynchronous digital controller asynchronously generating the digital value; and a current Digital-to-Analog Converter (DAC) that controls a shunt current from the output node to regulate the output voltage, the current DAC increasing the shunt current in response to the asynchronous digital controller increasing the digital value, the current DAC decreasing the shunt current in response to the asynchronous digital controller decreasing the digital value;

wherein the output voltage is asynchronously regulated by digital feedback from the output voltage.

20. The digital regulator of claim 19 further comprising:

an antenna for receiving transmitted power;

a bridge for converting an A.C. signal on the antenna to a D.C. signal on the output node;

a digital comparator that compares the digital value from the asynchronous digital controller to a digital threshold, the digital comparator driving a data signal high when the digital value is above the digital threshold, the digital comparator driving the data signal low when the digital value is below the digital threshold;

wherein data is encoded by a transmitter that modulates the transmitted power;

wherein the data signal is recovered data that corresponds to the data encoded by the transmitter;

wherein the transmitted power is modulated to carry Amplitude-Shifted-Keyed (ASK) encoded data from the transmitter.

\* \* \* \* \*